US007872549B2

(12) United States Patent
Tatomir et al.

(10) Patent No.: US 7,872,549 B2
(45) Date of Patent: Jan. 18, 2011

(54) QUASI-LUMPED RESONATOR APPARATUS AND METHOD

(75) Inventors: Paul J. Tatomir, Fallbrook, CA (US); Christ P. Tzelepis, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 307 days.

(21) Appl. No.: 12/121,217

(22) Filed: May 15, 2008

(65) Prior Publication Data

US 2009/0284330 A1 Nov. 19, 2009

(51) Int. Cl.
*H03H 7/01* (2006.01)
*H01P 7/00* (2006.01)

(52) U.S. Cl. ........................ 333/185; 333/219; 333/235

(58) Field of Classification Search ................. 333/219, 333/185, 227, 230, 231, 232, 235, 222, 223, 333/224

See application file for complete search history.

(56) References Cited

U.S. PATENT DOCUMENTS

| | | | | |
|---|---|---|---|---|
| 4,446,429 | A | 5/1984 | Froncisz et al. | |
| 4,480,239 | A | 10/1984 | Hyde et al. | |
| 4,504,788 | A | 3/1985 | Froncisz et al. | |
| 4,570,137 | A | 2/1986 | DiSilvestro | |
| 4,992,764 | A * | 2/1991 | Ayasli | 333/247 |
| 6,806,793 | B2 * | 10/2004 | Pillai et al. | 333/175 |
| 2003/0193380 | A1 * | 10/2003 | de Swiet et al. | 333/219 |

* cited by examiner

*Primary Examiner*—Benny Lee
*Assistant Examiner*—Gerald Stevens
(74) *Attorney, Agent, or Firm*—Harness, Dickey & Pierce, P.L.C.

(57) ABSTRACT

A quasi-lumped resonator apparatus that makes use of an inductive portion having a plurality of spines extending therefrom along at least a portion of a length thereof, and a capacitive portion electrically and physically coupled to an end of the inductive portion. The capacitive portion has a plurality of spaced apart capacitive fringe plates extending therefrom. A housing is included for enclosing the inductive and capacitive portions. In another aspect a method is disclosed for forming a quasi-lumped resonator.

20 Claims, 7 Drawing Sheets

FIG 1A
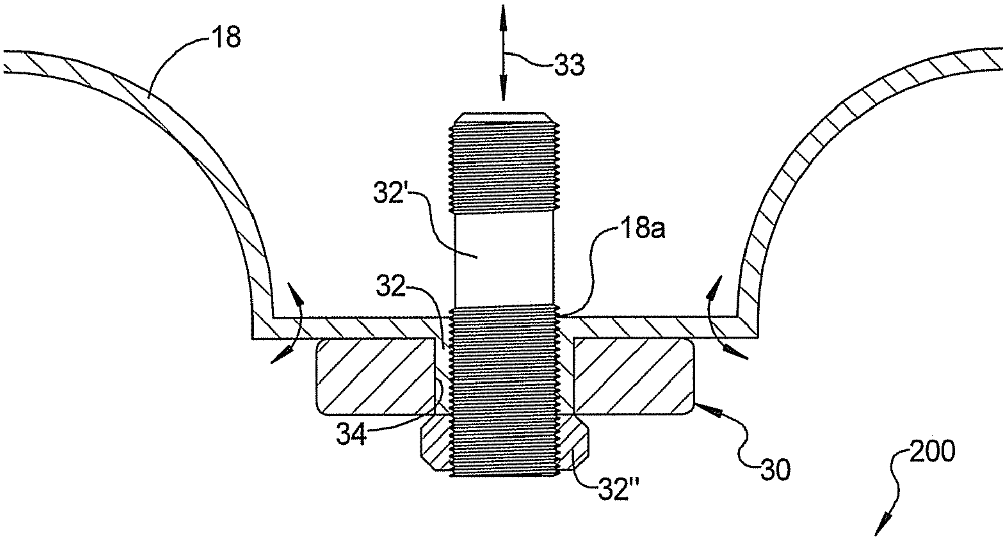
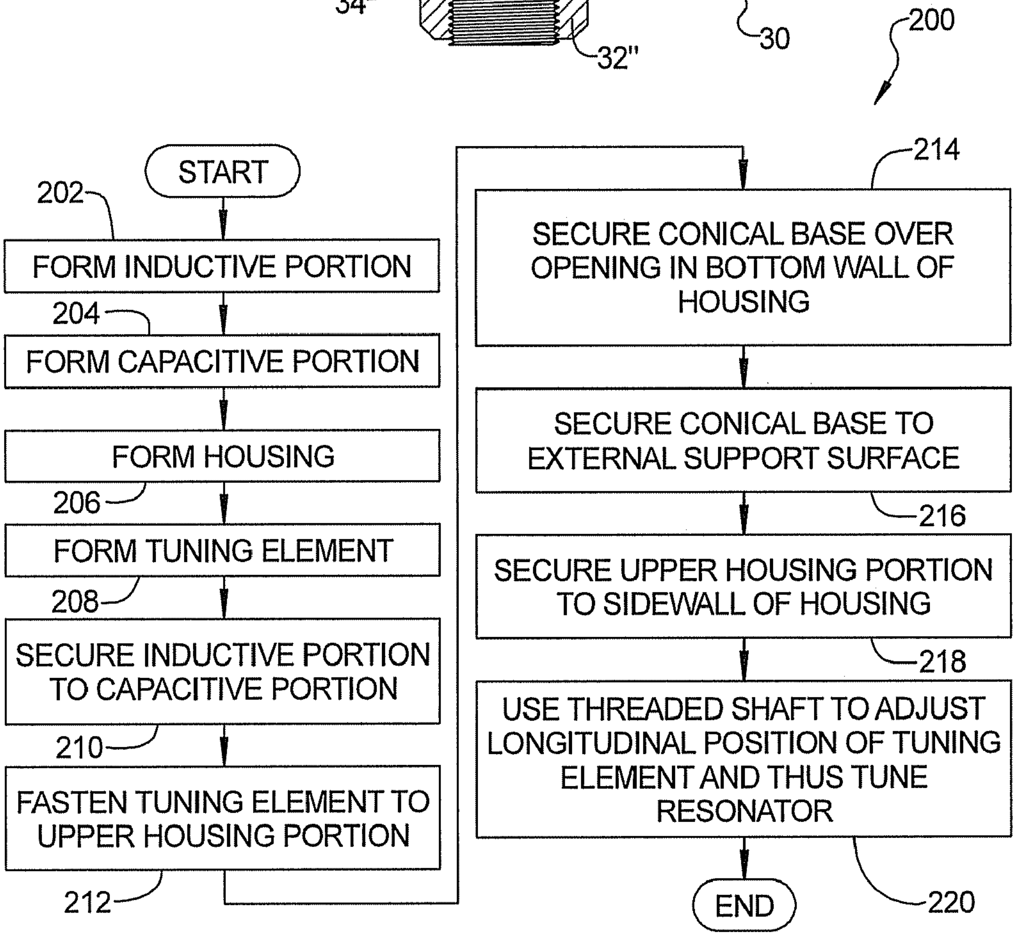
FIG 7

FIG 4
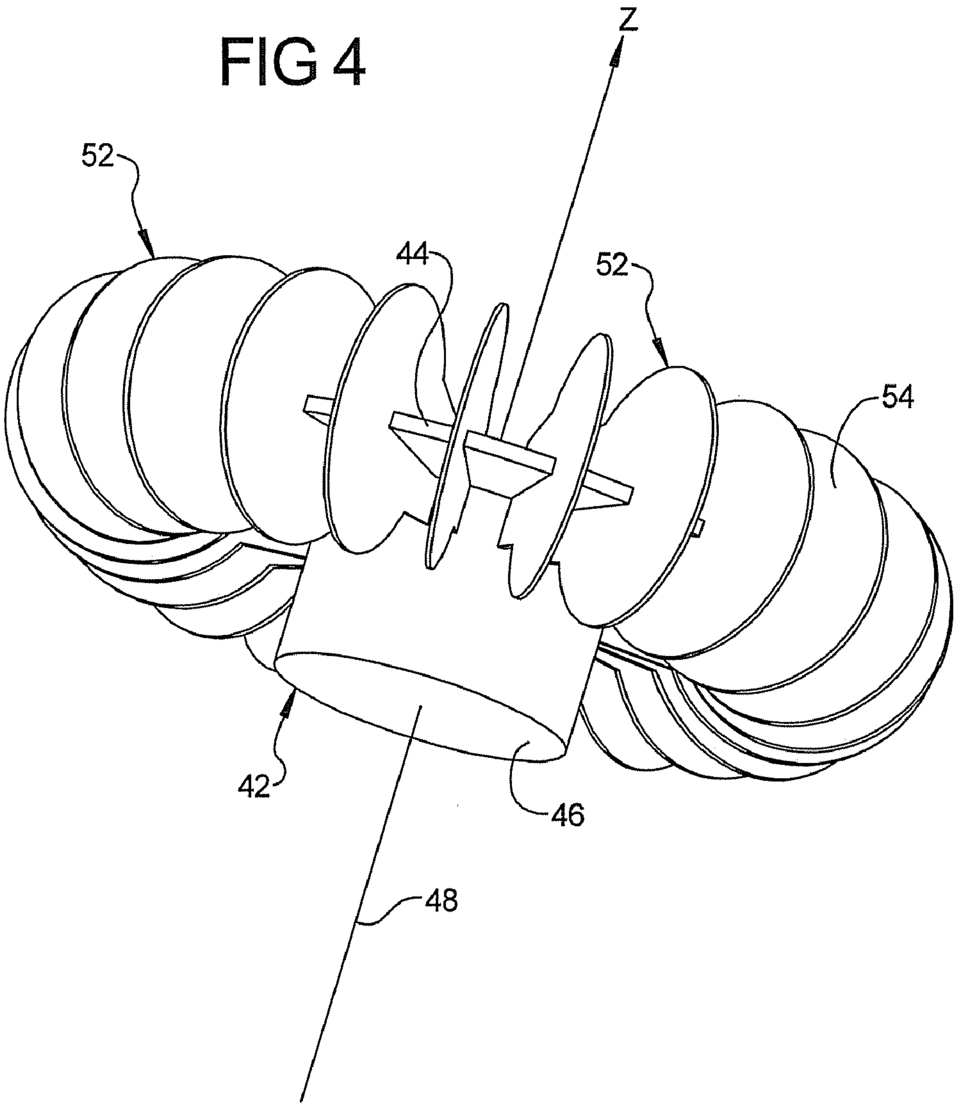
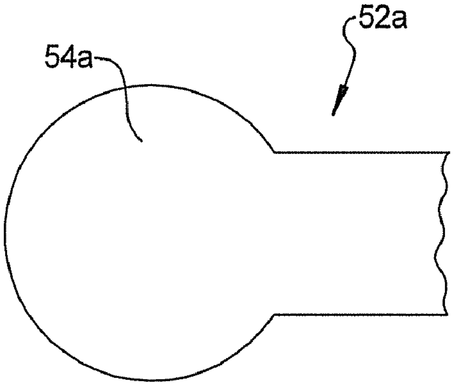
FIG 4A

QUASI-LUMPED RESONATOR APPARATUS AND METHOD

FIELD

The present disclosure relates to resonators, and more particularly to an electromagnetic wave resonator structure and method of forming same that is highly resistant to multipactor breakdown under high power applications.

BACKGROUND

The statements in this section merely provide background information related to the present disclosure and may not constitute prior art.

Currently available coaxial resonators have significant difficulty sustaining operation under high power without the use of high risk and costly break down preclusion techniques. At present, a coaxial resonator often needs to be either pressurized with a gas or be DC biased to avoid breaking down, due to the multipactor phenomenon, when high power is applied to it. The multipactor phenomenon is a secondary electron resonance phenomenon that involves a recurrent RF breakdown of the resonator. More specifically, the recurrent RF breakdown involves the emission of secondary electrons that are stripped off the capacitive portion of the resonator structure, thus rendering the resonator useless, and potentially destroying the resonator.

Typical coaxial resonators used in high power applications often use smooth surfaced cylindrical sections that form electromagnetic field lines of minimal curvature. Such resonators often need to be either gas pressurized or electrically DC biased to prevent them from breaking down under an application of high power. Pressure vessels or auxiliary DC biasing circuitry is therefore needed. Both of these conventional means add additional mass, equipment, complexity and cost to the resonator structure. The need to use a gas pressurized vessel can also inherently add risk to the resonator design and limit its lifetime.

SUMMARY

In one aspect the present disclosure relates to a quasi-lumped, resonator apparatus. The apparatus may comprise: an inductive portion having a plurality of spines extending therefrom along at least a portion of a length thereof; a capacitive portion electrically and physically coupled to an end of the inductive portion, the capacitive portion having a plurality of spaced apart capacitive fringe plates extending therefrom; and a housing for enclosing the inductive and capacitive portions.

In another aspect the present disclosure relates to a quasi-lumped, coaxially based resonator apparatus comprising: a tubular inductive portion having a plurality of spines extending radially therefrom along a major portion of a length thereof; a capacitive portion electrically and physically coupled to an end of the inductive portion, the capacitive portion having a plurality of spaced apart and radially extending capacitive fringe plates extending generally perpendicularly from the tubular inductive portion; and a housing for enclosing the inductive and capacitive portions.

In still another aspect of the present disclosure a method is disclosed for forming a quasi-lumped resonator. The method may comprise: forming an inductive portion as a cylindrical component having a plurality of spines extending therefrom along at least a portion of a length thereof; electrically and mechanically coupling a capacitive portion having a plurality of spaced apart capacitive fringe plates extending radially therefrom, to an end of the inductive portion; and enclosing the inductive and capacitive portions in a housing.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 1A is a partial cross-sectional view of the apparatus of FIG. 1 showing the tuning element and its coupling to the upper housing portion in greater detail;

FIG. 4 is a bottom perspective view of the capacitive portion, where it is to be attached to the inductive portion;

FIG. 4A is a view of another shape that may be used for the outer portion of the capacitive fringe plates;

FIG. 7 is a flowchart of operations that may be used to form the apparatus.

DETAILED DESCRIPTION

The following description is merely exemplary in nature and is not intended to limit the present disclosure, application, or uses.

Figure 1:
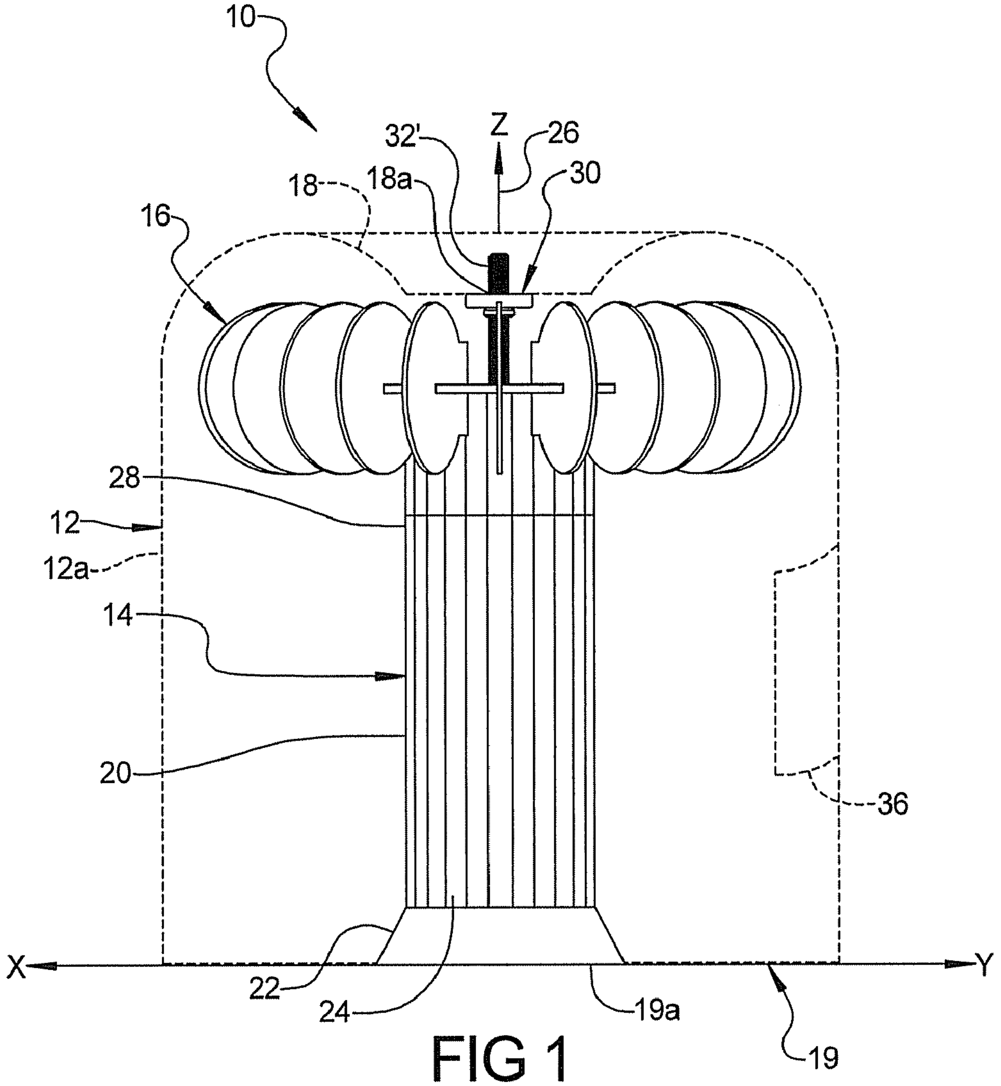
FIG. 1 is a side view of a quasi-lumped, coaxially based resonator apparatus in accordance with an embodiment of the present disclosure, with a housing thereof shown in dashed lines so that the interior components are visible.

Referring to FIG. 1 there is shown a quasi-lumped, coaxially based resonator apparatus 10 in accordance with one embodiment of the present disclosure. The apparatus 10 includes a housing 12 within which is housed an inductive portion 14 and a capacitive portion 16. The housing 12 may be a hollow metal structure having a sidewall portion 12*a* and an integrally formed bottom wall portion 19, with the bottom wall portion 19 having an opening 19*a*. An upper end of the sidewall portion 12*a* may be fixedly secured to an upper housing portion 18 either via suitable mechanical fasteners or via adhesives or by any suitable method of attachment. The upper housing portion 18 has a generally half toroidal shape having a central opening 18*a* for a tuning element, which will be discussed in the following paragraphs. The upper housing portion 18 may be secured to the housing sidewall 12*a* once the inductive portion 14 and capacitive portion 16 are fully assembled and positioned within the housing 12. Alternatively, housing portions 12 and 19 may be formed as separate components and fastened together using suitable fastening elements or adhesives.

The inductive portion 14 may include a tubular main body portion 20 having a conical base 22 for mounting and as an area for electrical connections. The conical base 22 is positioned over the opening 19*a* in the bottom wall 19. The conical base 22 may also have a flange or like structure that permits it, and thus the housing 12, to be fixedly secured to another support surface.

The tubular main body portion 20 may include a plurality of spines 24 that extend from the main body portion 20 radially outwardly from an axial center 26 of the main body portion 20. The capacitive portion 16 is electrically and mechanically coupled, such as by a friction fit or suitable fasteners or adhesives, to an upper portion 28 of the main body portion 20. A cylindrical tuning element 30 having a central opening 34 is positioned over a boss portion 32 formed in the upper housing portion 18 and secured against an inside surface of the upper housing portion 18 adjacent to, but not in contact with, the capacitive portion 16. The tuning element 30 enables the resonant frequency of the apparatus 10 to be fine tuned. An opening 36 may be formed in the housing 12 to enable electromagnetic coupling of the resonant frequency electromagnetic wave energy produced by the apparatus 10 to an external component, for example a microstrip or coaxial transmission line.

Figure 2:
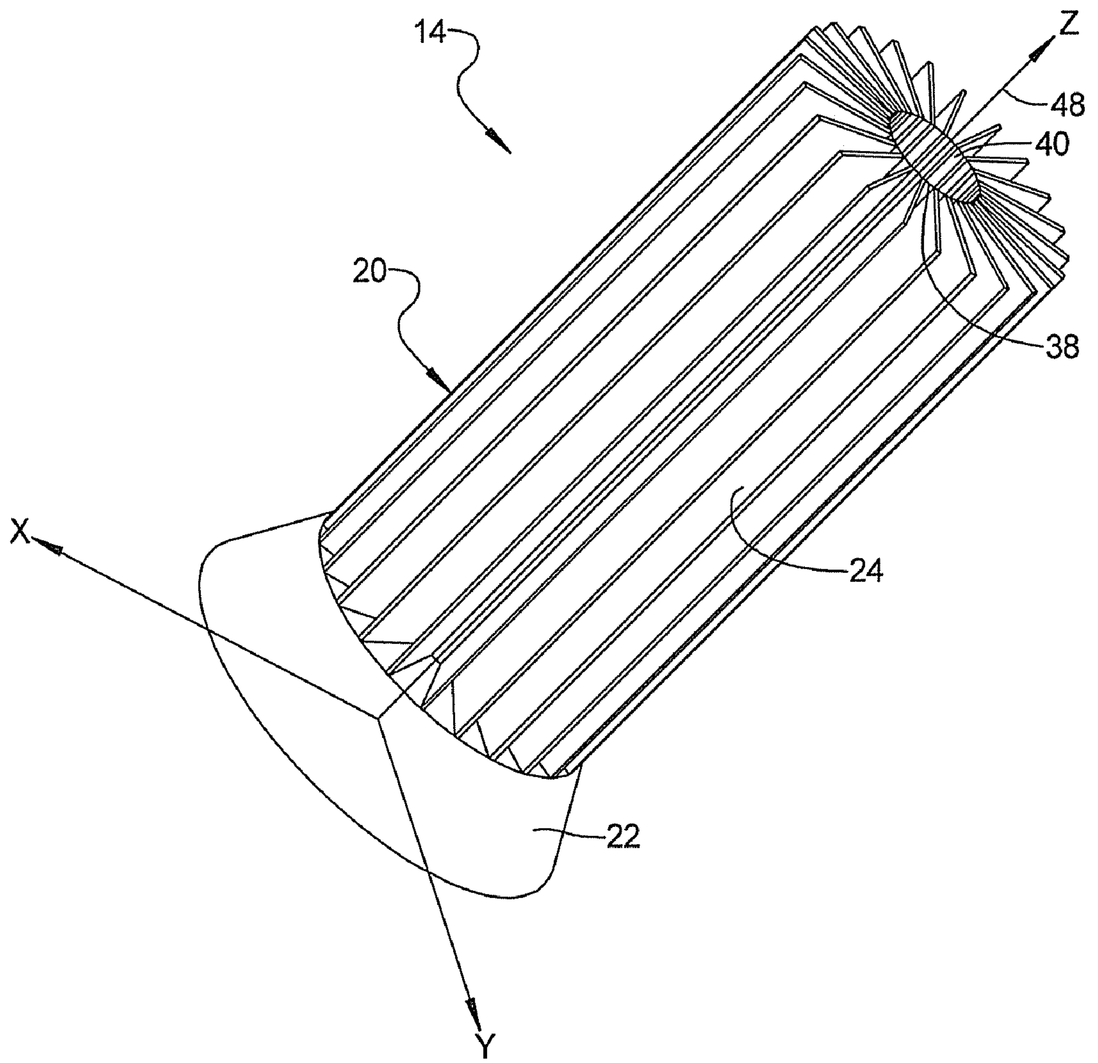
FIG. 2 is a perspective view of an inductive portion of the apparatus.

Referring to FIG. 2 the inductive portion 14 is shown in greater detail. The main body portion 20 may include a hollow tubular wall portion 38 that forms a bore 40. However, the tubular main body portion 20 could just as readily be formed as a solid component. Incorporating the bore 40, however, will provide a degree of weight savings. The spines 24 may extend along a major portion of the length of the wall portion 38, and preferably may extend along the full length of the tubular wall portion 38. The spines 24 may vary in shape and dimension to suit specific applications. The spacing of the spines 24, as well as the overall number employed, may also be varied to enable the inductive portion 14 to be designed for a specific application. However, in one embodiment preferably about 20-30 spines 24 are formed to extend radially from the tubular wall portion 38. The inductive portion 14 may be formed as a single piece component from metal or as a multipiece component. The main body portion 20 may be coated with silver plating to reduce loss. The overall length of the main body portion 20 will be selected to meet the needs of a specific application, but in one example it may be about four to six inches (102 mm-152 mm) in length when the apparatus 10 is being used in a UHF application to form a passband filter centered at a frequency of 250 MHz. The overall diameter of the main body portion 20 may also vary as needed to tune the apparatus 10 for a specific application. But when used to form a passband filter with a center frequency about 250 MHz, the diameter will typically be between about four to eight inches (101 mm-203 mm), depending on absolute loss requirements.

Figure 3:
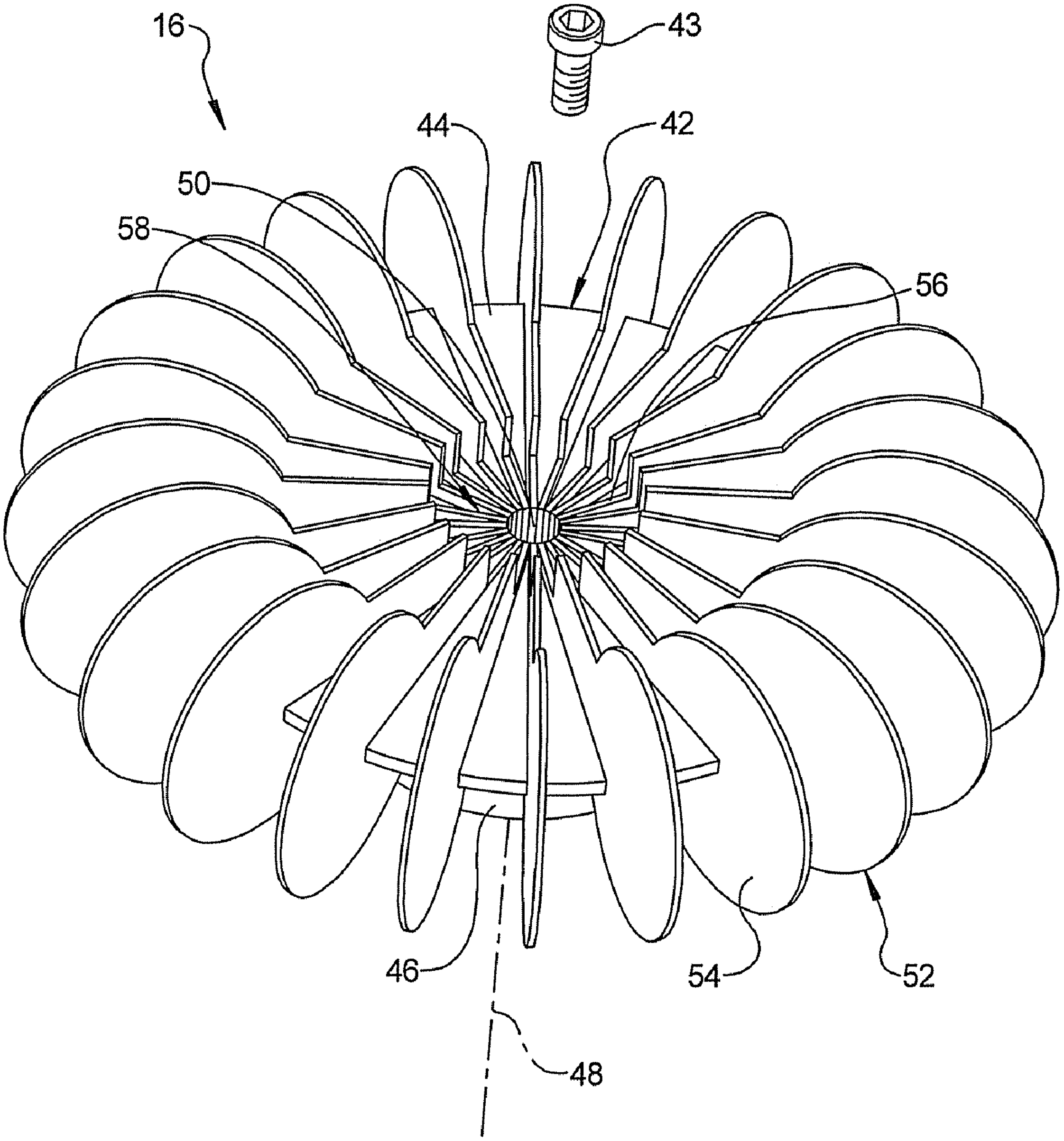
FIG. 3 is a top perspective view of the capacitive portion of the apparatus.

Referring to FIGS. 3 and 4, the capacitive portion 16 is shown in greater detail. The capacitive portion 16 may be formed as a single piece component from a single piece of metal, or alternatively as a multipiece component. The capacitive portion 16 may form a generally toroidal shape that fits partially within the generally toroidal shape of the upper portion 18 of the housing 16 when the apparatus 10 is fully assembled. The capacitive portion 16 may include a central support portion 42 having a flange 44 and a coaxially aligned coupling sleeve 46. The flange 44 has an axial center 48 at which a threaded hole 50 may be formed. Extending radially outwardly from the axial center 48 of the flange 44 is a plurality of spaced apart capacitive fringe plates 52. The fringe plates 52 may each have a generally circular outer portion 54 and a notched inner portion 56. The notched inner portion 56 enables a recess 58 to be formed at which the capacitive portion 16 may be attached to the inductive portion 14 with at least one threaded fastener 43. It is important to note that fastener 43 needs to be non-metallic or that some form of insulating sleeve needs to be used so that no metallic (i.e., conductive) connection is formed by the use of the fastener 43 between the inductive portion 14 and the capacitive portion 16. Such metallic contact would short out the apparatus 10.

Referring briefly to FIG. 1A, the tuning element 30 may be fastened to the upper housing portion 18 at its axial center via a threaded stud 32' that extends through a threaded boss portion 32 of the upper housing portion 18, and held on the boss by a threaded nut 32". The threaded boss 32 receives the threaded stud 32' and the tuning element 30 is secured via a separate non-metallic nut or suitable fastener 32" over one end of the threaded shaft 32'. Thus, the tuning element 30 is held adjacent to the capacitive portion 16 but not in contact with the capacitive portion 16. Thus, the tuning element 30 does not touch the capacitive portion 16 once the apparatus 10 is fully assembled, nor while the tuning element 30 is being adjusted. The tuning element 30 may be silver plated, or otherwise metallic or made from a suitable dielectric material. An external frame-like device (not shown) that is coupled to the threaded stud 32' may be used to urge the tuning element 30 either downwardly or upwardly in accordance with arrow 33 to change the longitudinal position of the tuning element 30 relative to the capacitive portion 16. The entire capacitive portion 16 may be coated with a silver plating or copper plating to reduce losses. The capacitive portion 16 may also be formed from a plurality of independent component parts or as a single piece component from a single piece of metal.

The radius of curvature of the circular outer portion 54 of each fringe plate 52, and thus the collective area of the fringe plates 52, may vary as needed to fine tune the apparatus 10 for specific applications. However, if the apparatus 10 is used as a filter in the UHF band, it is expected that the radius of each fringe plate 52 may typically be between about 25%-35% of the overall radius of the capacitive portion 16. The thickness of each fringe plate 52 may also vary widely to meet the needs of specific applications, but in one example may be between 0.01 inch-0.06 inch (0.254 mm-1.524 mm). But again, these factors may vary considerably depending on the specific application and resonant frequency which the apparatus 10 is designed to operate at.

While the capacitive fringe plates 52 are shown as having the generally circular outer portion 54, this shape could also be tailored to meet the needs of a specific application. For example, FIG. 4A shows a generally tear drop shaped outer portion 54*a* for the capacitive fringe plate 52*a*. Such a shape for the fringe plates would provide capacitive portion 16 with the shape of an asymmetric toroid. The tear drop shape may be added to further increase the power handling of the resonator apparatus 10 in extreme cases. It may also be useful as a design trade off. Its use may also enable the designer to replace part of the length of the inductive portion 14 with a smooth surface. In that case, inductive portion 14 would have spines over less than 100% of its length with a simple cylindrical surface on a portion of its length.

Figure 5:
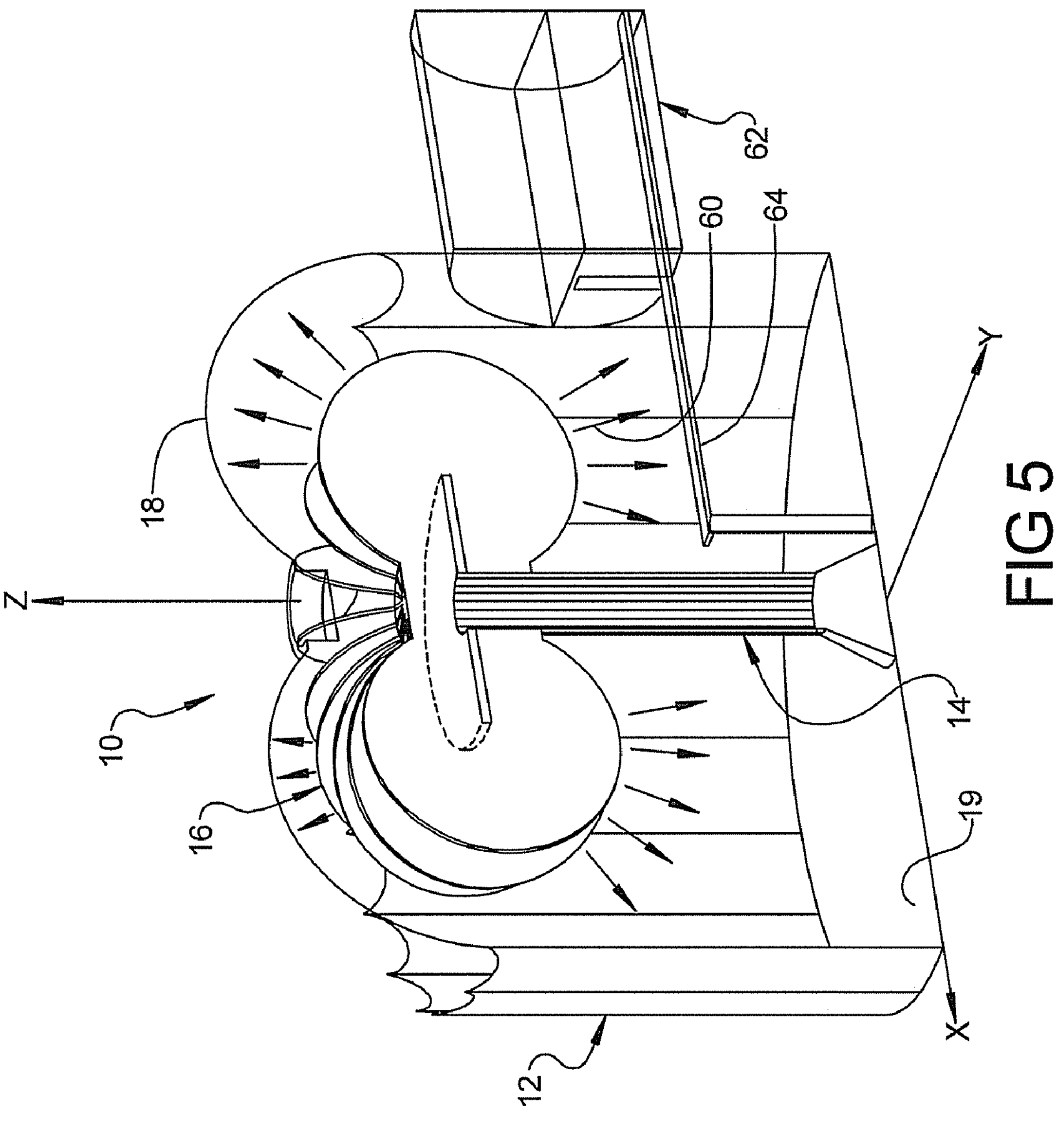
FIG. 5 is a cross sectional view of the apparatus of FIG. 1 coupled to a quasi transverse electromagnetic (TEM) microstrip line and illustrating the curving electromagnetic fringe field lines radiating from the capacitive fringe plates.

Important advantages of the apparatus 10 are the construction, and particularly the shape, of the capacitive portion 16, as well as the spines 24 on the inductive portion 14. These features enable high curvature fringing electromagnetic fields having a high gradient to be formed that are much less susceptible to multipactor breakdown under high intensity electromagnetic fields. The use of the capacitive fringe plates 52 and the spines 24 enables the total surface area of the capacitive portion 16, and the total surface area of the inductive portion 14, to both be maintained but limits the amount of total surface area from which electron stripping can occur with the apparatus 10. More specifically, the use of the fringe plates 52 provides an increased surface area via fringe fields to obtain the desired sufficient total capacitance, but since the increased surface area is not provided by a simple flat surface area, the proclivity for increased electron stripping is significantly reduced or eliminated. The high curvature fringing electromagnetic fields are shown in simplified form in FIG. 5 and denoted by reference numeral 60. FIG. 5 also shows an exemplary microstrip transmission line 62 magnetically coupled to the apparatus 10 with the conductive element 64 of the microstrip line extending within the housing 12.

The apparatus 10, due to its high curvature and high gradient electromagnetic fringing fields, does not require a pressurized vessel or auxiliary DC biasing circuitry to resist the occurrence of the multipactor phenomenon. Such components have often been required by previously developed, conventional coaxial transverse electromagnetic (TEM) resonators. This also enables the apparatus 10 to be constructed with less cost, less weight and less complexity than previously developed coaxial resonators. Eliminating the need to use a pressurized vessel also eliminates any risk of explosion in operating the resonator 10 that would otherwise be present when using a pressurized vessel to house the inductive and capacitive subsections. The lack of a pressurized vessel also eliminates the risk that the vessel will leak over time, which can cause a critical pressure to be reached within the vessel during operation that in turn produces corona breakdown within the device. When this happens, the device can be destroyed by the internal plasma breakdown within it. This risk is completely eliminated with the apparatus 10 because of its non-pressurized housing 12.

Figure 6:
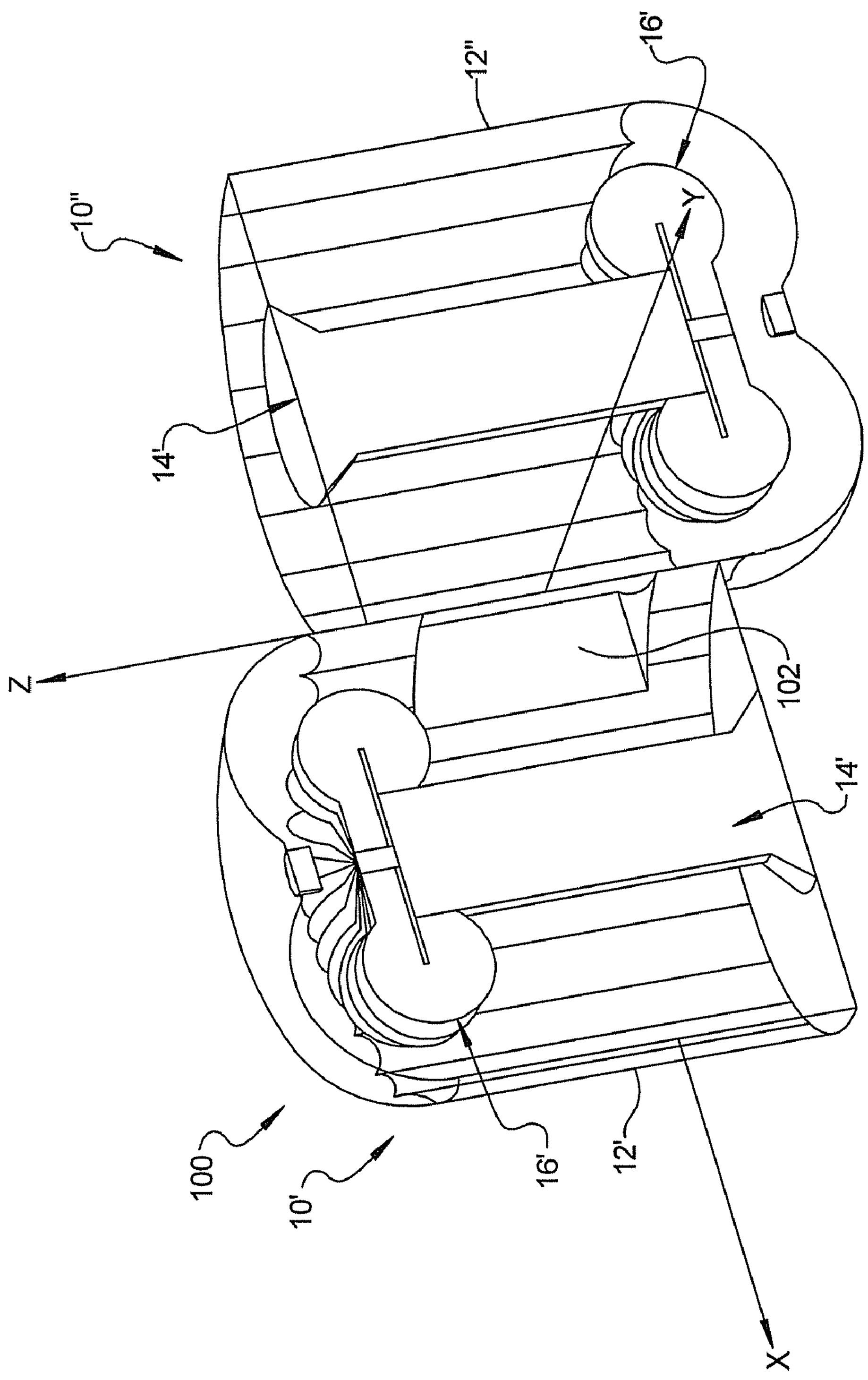
FIG. 6 is a perspective illustration of a pair of the apparatuses of the present disclosure being used to form a second order filter.

FIG. 6 illustrate an embodiment 100 in which two of the apparatuses 10' and 10" are used to form a second order filter. The housing 12' of the lumped resonator 10' is interfaced to the housing 12" of the resonator 10" by a passageway 102 that enables electromagnetic wave energy from resonator 10' to radiate from one housing to the other. It will be appreciated that even higher order filters may just as easily be constructed.

Referring to FIG. 7, a method 200 is shown for constructing the apparatus 10. At operation 202 the inductive portion 14 is formed, for example from a single piece of metal. At operation 204 the capacitive portion 16 is formed, for example from a single piece of metal. At operation 206 the housing 12 is formed. At operation 208 the tuning element 30 is formed. At operation 210 the inductive portion 14 is secured to the capacitive portion 16. At operation 212 the tuning element 30 is fastened to the upper housing portion 18. At operation 214 the conical base 22 is secured over the opening 19*a* in the bottom wall 19 of the housing 12. At operation 216 the conical base 22 may be bolted or otherwise secured to a support surface. At operation 218 the upper housing portion 18 is secured to the sidewall 12*a* of the housing 12. At operation 220 the threaded shaft 32' is used to adjust the longitudinal position of the tuning element 30, and thus tune the apparatus 10.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A quasi-lumped resonator apparatus comprising:

an inductive portion having a plurality of spines extending therefrom along at least a portion of a length thereof; and a capacitive portion electrically and physically coupled to an end of the inductive portion, the capacitive portion having a plurality of spaced apart capacitive fringe plates arranged in a toroidal configuration extending therefrom, with the plurality of spaced apart capacitive fringe plates further having major surface portions extending generally parallel to a longitudinal axis of the inductive portion and radially from an axial center of the capacitive portion; and a housing for enclosing the inductive and capacitive portions.

2. The apparatus of claim 1, wherein said plurality of spines extend radially from a body portion of said inductive portion along a substantial portion of the inductive portion.

3. The apparatus of claim 1, wherein said plurality of spaced apart capacitive fringe plates of said capacitive portion are arranged to extend orthogonally to said inductive portion.

4. The apparatus of claim 1, wherein said plurality of spaced apart capacitive fringe plates each have a portion having a generally circular shape.

5. The apparatus of claim 1, wherein said capacitive portion includes a central support portion having a flange and a coupling sleeve, said plurality of spaced apart capacitive fringe plates extending from said flange and said coupling sleeve being electrically and mechanically secureable to said end of said inductive portion.

6. The apparatus of claim 5, wherein said capacitive portion is formed from a single piece of metal.

7. The apparatus of claim 6, wherein said capacitive portion is plated with at least one of silver and copper.

8. The apparatus of claim 1, further comprising a tuning element disposed adjacent said capacitive portion for assisting in tuning said apparatus.

9. The apparatus of claim 1, wherein said inductive portion is formed as a single piece component.

10. The apparatus of claim 1, wherein said housing includes an upper portion having a generally toroidal profile for conforming to a profile of a portion of said capacitive portion.

11. The apparatus of claim 1, wherein said plurality of spaced apart capacitive fringe plates have at least a portion having a generally tear dropped shape.

12. The apparatus of claim 1, wherein said inductive portion includes a conical shaped input port for receiving electromagnetic wave energy.

13. A quasi-lumped, coaxially based resonator apparatus comprising:

a tubular inductive portion having a plurality of spines extending radially therefrom along a major portion of a length thereof; and a capacitive portion electrically and physically coupled to an end of the inductive portion, the capacitive portion forming a generally toroidal shape and having a plurality of spaced apart and radially extending capacitive fringe plates extending generally perpendicularly from said tubular inductive portion, with said plurality of spaced apart capacitive fringe plates having major surface portions extending generally parallel to a longitudinal axis of the tubular inductive portion, and radially from an axial center of the capacitive portion; and a housing for enclosing the inductive and capacitive portions, a portion of said housing shaped to conform to a portion of the toroidal shape of the capacitive portion.

14. The apparatus of claim 13, further comprising a tuning element electrically and physically coupled adjacent to said capacitive portion at an axial center of said capacitive portion, but not in contact with said capacitive portion.

15. The apparatus of claim 13, wherein said axial center of said capacitive portion is aligned with an axial center of said inductive portion.

16. The apparatus of claim 13, wherein said housing comprises an upper portion having a partial toroidal shape in accordance with a profile of said capacitive portion.

17. The apparatus of claim 13, wherein said capacitive portion includes a central support portion having a flange and a coupling sleeve, said plurality of spaced apart capacitive fringe plates extending from said flange and said coupling sleeve being electrically and mechanically secureable to said end of said inductive portion.

18. A method for forming a quasi-lumped resonator, the method comprising:

forming an inductive portion as a cylindrical component having a plurality of spines extending therefrom along at least a portion of a length thereof;

electrically and mechanically coupling a capacitive portion having a plurality of spaced apart capacitive fringe plates extending radially therefrom, to an end of said inductive portion, the plurality of spaced apart capacitive fringe plates of the capacitive portion forming a toroidal shape with the plurality of spaced apart capacitive fringe plates having major surface portions extending parallel to a longitudinal axis of the inductive portion and radially relative to an axial center of the capacitive portion; and enclosing the inductive and capacitive portions in a housing, where the housing is shaped at least partially in accordance with a contour of the toroidal shape of the capacitive portion.

19. The method of claim 18, wherein electrically and mechanically coupling the capacitive portion comprises electrically and mechanically coupling the toroidally shaped capacitive portion having the plurality of spaced apart capacitive fringe plates extending radially therefrom, and in a direction generally perpendicular to said inductive portion.

20. The method of claim 18, further comprising using a tuning element to tune the resonator.

* * * * *